(12) United States Patent
Van Der Mark et al.

(10) Patent No.: US 9,372,399 B2
(45) Date of Patent: Jun. 21, 2016

(54) IMPRINT LITHOGRAPHY METHOD AND IMPRINTABLE MEDIUM

(75) Inventors: Martinus Bernardus Van Der Mark, Best (NL); Vadim Yevgenyevich Banine, Deurne (NL); Andre Bernardus Jeunink, Bergeijk (NL); Johan Frederik Dijksman, Weert (NL); Sander Frederik Wuister, Eindhoven (NL); Emiel Andreas Godefridus Peeters, Eindhoven (NL); Johan Hendrik Klootwijk, Eindhoven (NL); Roelof Koole, Eindhoven (NL); Christianus Martinus Van Heesch, Eindhoven (NL); Ruediger Guenter Mauczok, Erkelenz (DE); Jacobus Bernardus Giesbers, Son en Breugel (NL)

(73) Assignee: ASML NETHERLANDS B.V., Veldhoven (NL)

( * ) Notice: Subject to any disclaimer, the term of this patent is extended or adjusted under 35 U.S.C. 154(b) by 687 days.

(21) Appl. No.: 13/812,459

(22) PCT Filed: Jul. 21, 2011

(86) PCT No.: PCT/EP2011/062553
§ 371 (c)(1),
(2), (4) Date: Jan. 25, 2013

(87) PCT Pub. No.: WO2012/025316
PCT Pub. Date: Mar. 1, 2012

(65) Prior Publication Data
US 2013/0120725 A1 May 16, 2013

Related U.S. Application Data

(60) Provisional application No. 61/377,399, filed on Aug. 26, 2010.

(51) Int. Cl.
*G03F 7/00* (2006.01)
*B82Y 10/00* (2011.01)
*B82Y 40/00* (2011.01)

(52) U.S. Cl.
CPC ............... *G03F 7/0002* (2013.01); *B82Y 10/00* (2013.01); *B82Y 40/00* (2013.01)

(58) Field of Classification Search
CPC ...... B82Y 10/00; B82Y 40/00; G03F 7/0002; G03F 7/20; H01L 29/78621
USPC .......... 355/53, 77; 430/5, 269, 310, 320, 322, 430/325, 326, 396; 216/27, 40, 44, 48, 49, 216/52, 57
See application file for complete search history.

(56) References Cited

U.S. PATENT DOCUMENTS 4,731,155 A 3/1988 Napoli et al.
5,772,905 A 6/1998 Chou
(Continued)

FOREIGN PATENT DOCUMENTS

EP 1 331 516 7/2003
EP 2 199 855 6/2010
(Continued)

OTHER PUBLICATIONS

International Search Report mailed Oct. 4, 2011 in corresponding International Patent Application No. PCT/EP2011/062553.
(Continued)

*Primary Examiner* — Toan Ton
*Assistant Examiner* — Mona M Sanei
(74) *Attorney, Agent, or Firm* — Pillsbury Winthrop Shaw Pittman LLP

(57) ABSTRACT

An imprint lithography method is disclosed for reducing a difference between an intended topography and an actual topography arising from a part of a patterned layer of fixed imprintable medium. The method involves imprinting an imprint lithography template into a layer of flowable imprintable medium to form a patterned layer in the imprintable medium, and fixing the imprintable medium to form a patterned layer of fixed imprintable medium. Local excitation is applied to the part of the patterned layer to adjust a chemical reaction in the part of the patterned layer to reduce the difference between the intended topography and the actual topography arising from the part of the fixed patterned layer of imprintable medium when this is subsequently used as a resist for patterning the substrate. An imprint medium suitable for imprint lithography with the method is also disclosed.

20 Claims, 4 Drawing Sheets

(56) References Cited

U.S. PATENT DOCUMENTS

| | | |
|---|---|---|
| 6,334,960 B1 | 1/2002 | Willson et al. |
| 7,376,259 B1 * | 5/2008 | Dakshina-Murthy .. B82Y 10/00 382/144 |
| 2002/0090578 A1 * | 7/2002 | Schaefera ............. B21B 27/005 430/320 |
| 2003/0138704 A1 * | 7/2003 | Mei ........................ B82Y 10/00 430/5 |
| 2004/0124566 A1 | 7/2004 | Sreenivasan et al. |
| 2005/0274693 A1 | 12/2005 | Heidari et al. |
| 2009/0286379 A1 | 11/2009 | Hong |
| 2010/0160478 A1 * | 6/2010 | Nilsson .................. B82Y 10/00 522/170 |
| 2011/0226735 A1 | 9/2011 | Wuister et al. |

FOREIGN PATENT DOCUMENTS

| | | |
|---|---|---|
| WO | 02/067055 | 8/2002 |
| WO | 2009/069858 | 6/2009 |

OTHER PUBLICATIONS

Jan Haisma et al., "Mold-assisted nanolithography: A process for reliable pattern replication," J. Vac. Sci. Technol., vol. B 14, No. 6, pp. 4124-4128 (Nov./Dec. 1996).

International Preliminary Report on Patentability mailed Mar. 7, 2013 in corresponding International Patent Application No. PCT/EP2011/062553.

* cited by examiner

IMPRINT LITHOGRAPHY METHOD AND IMPRINTABLE MEDIUM

CROSS-REFERENCE TO RELATED APPLICATIONS

This application is the U.S. national phase entry of International Patent Application No. PCT/EP2011/062553, filed Jul. 21, 2011, which claims the benefit of priority from U.S. provisional application 61/377,399, which was filed on Aug. 26, 2010 and which is incorporated herein in its entirety by reference.

FIELD

The present invention relates to imprint lithography, and in particular to an imprint lithography method for improving uniformity of critical dimension for imprint lithography.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features that has gained increasing interest is so-called imprint lithography, which generally involves the use of a "stamp" (often referred to as an imprint lithography template or an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density and/or pattern feature resolution on the imprint lithography template.

Imprint lithography involves the patterning of an imprintable medium on a surface of a substrate to be patterned. The patterning may involve bringing together a patterned surface of an imprint lithography template and a layer of imprintable liquid medium (e.g., moving the imprint lithography template toward the imprintable medium, or moving the imprintable medium toward the imprint lithography template, or both) such that the imprintable medium flows into recesses in the patterned surface and is pushed aside by protrusions on the patterned surface. The recesses define pattern features of the patterned surface of the imprint lithography template. The patterned features may have features having dimensions of the order of micrometers or nanometers. Typically, the imprintable medium is flowable when the patterned surface and the imprintable medium are brought together. Following patterning of the imprintable medium, the imprintable medium is suitably brought into a non-flowable or frozen state (i.e. a fixed state), for example by illuminating the imprintable medium with actinic radiation such as UV radiation. The patterned surface of the imprint lithography template and the patterned imprintable medium are then separated. The substrate and patterned imprintable medium are then typically processed further in order to pattern or further pattern the substrate (e.g. by etching or the like). The imprintable medium may be provided in the form of droplets (e.g. deposited by ink jet printing) on the surface of a substrate to be patterned, but may alternatively be provided using spin coating or the like.

SUMMARY

In optical lithography, where a beam of radiation is passed through or reflected from a patterning device (such as a mask or the like), the radiation beam will be patterned according to the pattern provided by the patterning device. The patterned radiation beam is then projected onto a substrate in order to provide a pattern on that substrate. Due to non-uniformities in the patterning device, or other elements of an optical lithography apparatus, the pattern projected onto the substrate may not be as intended. For example, heating of the patterning device or a projection system used to project the patterned radiation beam onto the substrate may cause the patterning device or projection system to deform, which may in turn introduce non-uniformity into the patterned radiation beam that is projected onto the substrate. Non-uniformity in the pattern provided on the substrate may comprise, for example, an increase or a decrease in a dimension of the pattern of the radiation beam and thus in a feature provided on the substrate. It is desirable to ensure that the pattern features are provided on the substrate in a uniform and consistent manner across the substrate.

For example, in order to overcome the problem of non-uniformity, the radiation dose provided by one or more parts of the radiation beam may be controlled in order to change the dose of radiation that is provided on different areas of the substrate. For instance, the dose of radiation may be decreased in an area where it is known that non-uniformity in the lithographic apparatus (or during subsequent processing) would otherwise result in a pattern feature being applied to the substrate with a dimension that is larger than intended. Similarly, the dose of radiation may be increased if it is known that the non-uniformity in the lithographic apparatus will result in a pattern feature having a dimension smaller than intended.

In imprint lithography, similar problems of non-uniformity may arise. For instance, in imprint lithography, the imprint lithography template is the patterning device. When the imprint lithography template is constructed, non-uniformity in one or more pattern features (i.e. a topography) of the imprint lithography template may arise, for example, due to local variation in process conditions used in the manufacture of the imprint lithography template. Such variation may include, for example, plasma concentrations, e-beam writing errors, unintended variations in e-beam intensity during writing with the e-beam and the like. During an imprint, the imprint lithography template is imprinted into imprintable medium. In one embodiment of imprint lithography, actinic radiation (e.g. UV radiation) is used to irradiate the imprintable medium to fix the pattern provided in the imprintable medium by the imprint lithography template. However, a change in dose of the actinic radiation may not be expected to have an effect on a dimension of one or more pattern features provided on the substrate since the dimension of the one or more pattern features (i.e. dimension of a topography) is dictated by the dimension of the one or more pattern features (i.e. the topography) of the imprint lithography template which is fixed. Thus, systematic non-uniformity in an imprint lithography template presents a problem.

It is desirable, for example, to provide an imprint lithography method and an imprintable medium that obviate or mitigate at least one problem of the art, whether identified herein or elsewhere, or which provides an alternative to an existing imprint lithography method. In particular, it is desirable, for example, to provide an imprint lithography method and medium that provide a means for correction of systematic non-uniformity in a topography arising from imprint lithography.

According to an aspect, there is provided an imprint lithography method for reducing a difference between an intended topography and an actual topography arising from a part of a patterned layer of fixed imprintable medium, the method comprising: imprinting an imprint lithography template into a layer of flowable imprintable medium to form a patterned layer in the imprintable medium; fixing the imprintable medium to form a patterned layer of fixed imprintable medium; and applying local excitation to the part of the patterned layer to adjust a chemical reaction in the part of the patterned layer to reduce the difference between the intended topography and the actual topography arising from the part of the fixed patterned layer of imprintable medium.

As will be set out in more detail below, the topography (the actual topography) arises from the patterned layer typically being used as a resist layer for subsequent etching of a structure into a substrate. Despite there being an intention to provide one or more pattern features on the substrate having a specific dimension (e.g., width), the dimension of the resultant one or more pattern features (i.e. the actual topography) may not be as desired (i.e. the desired or intended topography). This may be due to non-uniformity in the dimension of one or more recesses in the imprint lithography template used to provide the one or more pattern features (i.e. the actual dimension does not conform to the intended dimension).

It will be appreciated that the use of the term "non-uniformity" is intended to encompass the situation where an actual dimension of a pattern feature provided on the substrate does not conform to, or with, an intended dimension of the pattern feature—i.e. the actual dimension does not conform to, or with, an intended dimension due to a non-uniformity in, for example, the manufacture of the imprint lithography template. Thus, the term "non-uniformity" encompasses non-conformities.

According to an aspect, there are provided imprint lithography methods for reducing a difference between an intended topography and an actual topography of a part of a patterned layer of imprintable medium (i.e. to reduce a non-uniformity in a part of a patterned layer of imprintable medium). The part of the patterned layer of imprintable may be, or comprise, one or more pattern features (e.g. one or more recesses or one or more protrusions).

The imprintable medium is fixed so that it substantially retains its shape after the patterned surface of the imprint template has been removed (i.e. after fixing the imprintable medium is longer flowable, but it may not necessarily be fully hardened or solidified as long as it is capable of being self-supporting and retaining its imprinted form). For instance, the imprintable medium may be fixed or cured by polymerization of a monomer within the imprintable medium such that the fixed imprintable medium is a polymeric medium.

The imprintable medium is suitably fixed by curing with first actinic radiation. The fixing of the imprintable medium may be by curing with first actinic radiation comprising a polymerization reaction of a first monomer of the imprintable medium.

By actinic radiation, in this specification, is meant radiation which is capable of inducing or initiating chemical reaction. Typically, ultra-violet (UV) radiation may be employed as actinic radiation. References to first or second actinic radiations mean that the first and second actinic radiations may have different wavelengths, or that they may have different distributions of wavelengths (even though the two different distributions may overlap for some wavelengths).

Although not wishing to limit the scope of the invention by any theory or hypothesis, it is postulated that the chemical reaction in the part of the patterned layer to reduce the difference between the intended topography and the actual topography arising from the part of the fixed patterned layer of imprintable medium may be effective as follows.

The chemical reaction, arising from reaction of a reacting compound, may, for instance, cause depletion in the concentration of the reacting compound at site where the chemical reaction is occurring rapidly, and that this depletion in concentration may be used to reduce a difference between the intended topography and the actual topography. For instance, the concentration difference may drive diffusion of the reacting compound from a site where the chemical reaction is occurring more slowly. For this embodiment, the temperature of the imprintable medium is suitably close to its glass temperature Tg, say within 20° C. of Tg, so that diffusion of a reacting compound is at a high rate.

This bulk diffusion of the reacting compound may give rise to an increased concentration of the reactive compound in a part where the chemical reaction has been enhanced. The reacting compound may be selected to have an effect on the etch-resistance of the fixed imprintable medium, so that a region with a higher concentration of reacting compound may have higher resistance to etching. This may be used to compensate for an unintended difference in dimension of one or more features for different parts of the patterned imprintable medium. This may also or instead give rise to local physical swelling of the fixed imprintable medium as a result of the local increased influx of reacting compound.

In an embodiment, after chemical reaction of a reacting compound, the reacted compound may be fixed in place (e.g. by polymerization) and any unreacted compound may be removed, for instance by leaching it from the fixed imprintable medium using a solvent leach. For such an embodiment, the temperature of the imprintable medium is suitably kept below Tg in order to limit diffusion of the reacting compound. Hence, in a part where the chemical reaction has been induced, the amount of reacting compound will be higher than in another part where it has not reacted. This may give rise to local physical shrinkage of the fixed imprintable medium as a result of the leaching.

In an embodiment, the chemical reaction may be a chemical reaction leading to increased dissolution rate, when subsequently etched, for the part of the fixed imprintable medium where the chemical reaction has been locally induced.

The chemical reaction in the part of the patterned layer to reduce the difference between the intended topography and the actual topography arising from the part of the fixed patterned layer of imprintable medium may comprise a polymerization reaction of a second monomer of the imprintable medium.

The local excitation may comprise local application, to the part, of a selected dose of first actinic radiation. This may be achieved by the selected dose applied to that part being a higher or a lower dose than that applied to a remainder of the imprintable medium.

The local excitation may suitably comprise local application to the part of a selected dose of second actinic radiation.

The local excitation may be applied after fixing the imprintable medium to form a patterned layer of fixed imprintable medium. However, it may be applied prior to or during the fixing. For instance, when applied after fixing, the local excitation may be applied after removal of the imprint lithography template from the patterned layer of fixed imprintable medium.

A mask may be used to control local application of the local excitation. For instance, where the local excitation involves illumination with actinic radiation a so-called grayscale mask may be used to control the intensity of radiation reaching different parts of the fixed imprintable medium when the grayscale mask is subjected to substantially uniform irradiation.

The local excitation may comprise or consist of local heating of the part. Local heating may be used in addition to local excitation by irradiation with actinic radiation such as UV radiation.

Local heating may, for instance, be provided by one or more beams of radiation.

In an embodiment, the local heating may be provided by directing a beam of radiation toward the patterned layer of imprintable medium, the radiation beam having a radiation intensity profile configured to provide the desired local heating.

In an embodiment, the local heating may be provided by scanning a beam of radiation relative to the patterned layer of imprintable medium, the radiation beam being modulated during scanning to ensure that local heating is applied to the part of the patterned layer of imprintable medium.

In an embodiment, the local heating may be provided by intersecting two or more beams of radiation at a point adjacent to the part of the patterned layer of imprintable medium.

With regard to the manner in which the chemical reaction in the part of the patterned layer reduces the difference between the intended topography and the actual topography arising from the part of the fixed patterned layer of imprintable medium, this may be achieved by various means as set out herein. For instance, a second monomer left unpolymerized after a polymerization reaction may be removed by leaching from the fixed imprintable medium by use of a solvent leach.

The chemical reaction may be a chemical reaction of a reacting compound, leading to depletion of the reacting compound in the part of the patterned layer of imprintable medium so that diffusion of the reacting compound into the part is induced.

The reacting compound may be a compound resistant to etching.

An embodiment of the invention involves a knowledge of the actual topography which would arise from the patterned layer of fixed imprintable medium, were the method of an embodiment of the invention not to be used, and comparing this with the desired topography. The actual topography arising from the part of the patterned layer of fixed imprintable medium (i.e. the part to be corrected by a method according to an embodiment of the invention) may be determined by measuring a topography of the part of the patterned layer of fixed imprintable medium. In other words the patterned layer of fixed imprintable medium to be adjusted may be measured directly, for instance immediately after the imprint template has been removed and before local excitation is applied. In an embodiment, a patterned layer of fixed imprintable medium formed previously using the same imprint template may be measured directly and the information used when applying the method to a later-imprinted patterned layer (which should exhibit substantially the same discrepancy between desired and actual topography because it has been formed from the same imprint template).

In an embodiment, the actual topography arising from the part of the patterned layer of fixed imprintable medium may be determined by measuring a topography of a part of the imprint lithography template that is to be used to form the part of the patterned layer of fixed imprintable medium.

In an embodiment, the actual topography arising from the part of the patterned layer of fixed imprintable medium may be determined by measuring a topography of an etched substrate formed using the part of a previously patterned layer of fixed imprintable medium, imprinted using the imprint lithography template, as a resist layer.

In an embodiment, the local excitation is applied with the fixed imprintable medium at a temperature less than but close to, or in excess of, its glass transition temperature, for instance within 20° C. of Tg, say within 10° C. or within 5° C. of Tg. This is thought to help ensure that any diffusion arising as a result of the application of the method may freely occur.

According to an aspect, there is provided an imprint medium for imprint lithography comprising first and second monomers, wherein the imprint medium is curable by a polymerization reaction of the first monomer induced by a first excitation leaving the second monomer substantially unpolymerized, and wherein the second monomer is polymerizable by a second excitation.

The imprintable medium is suitable for use with the method described herein, and where appropriate, any of the features as set out herein in relation to the method are also applicable to the imprint medium, and vice-versa.

For instance, the first monomer may be substantially polymerizable by the first excitation comprising irradiation with a first dose of first actinic radiation and the second monomer may be substantially polymerizable by the second excitation comprising irradiation with a second dose of first actinic radiation. In other words, for this embodiment, the first dose of first actinic radiation is sufficient to induce substantial polymerization of the first monomer, but is insufficient to induce substantial polymerization of the second monomer. A second dose of first radiation is used to induce the polymerization of the second monomer.

In an embodiment, the first monomer may be substantially polymerizable by the first excitation comprising irradiation with a first dose of first actinic radiation and the second monomer may be substantially polymerizable by the second excitation comprising irradiation with a second dose of second actinic radiation. In other words, for this embodiment, the first actinic radiation is effective for inducing substantial polymerization of the first monomer, but is not effective for inducing polymerization of the second monomer. A second actinic radiation is applied to provide substantial polymerization of the second monomer.

For instance, the first monomer may be an acrylate monomer. The imprintable medium may also comprise a polymerization initiator suited to act with acrylate monomer, such as a compound adapted to generate free radicals on illumination with suitable actinic radiation, such as UV radiation.

The second monomer may be an epoxy monomer. The imprintable medium may also comprise a polymerization initiator suited to act with epoxy monomer, such as a compound adapted to generate acid on illumination with suitable actinic radiation, such as UV radiation.

The aspects (and indeed embodiments) of the present invention can be used in isolation, or in combination, for example on different areas of a patterned layer of imprintable medium, or for different parts of the patterned layer of imprintable medium.

BRIEF DESCRIPTION OF THE DRAWINGS

Specific embodiments of the invention will be described with reference to the accompanying Figures, in which.

DETAILED DESCRIPTION

Figure 1A:
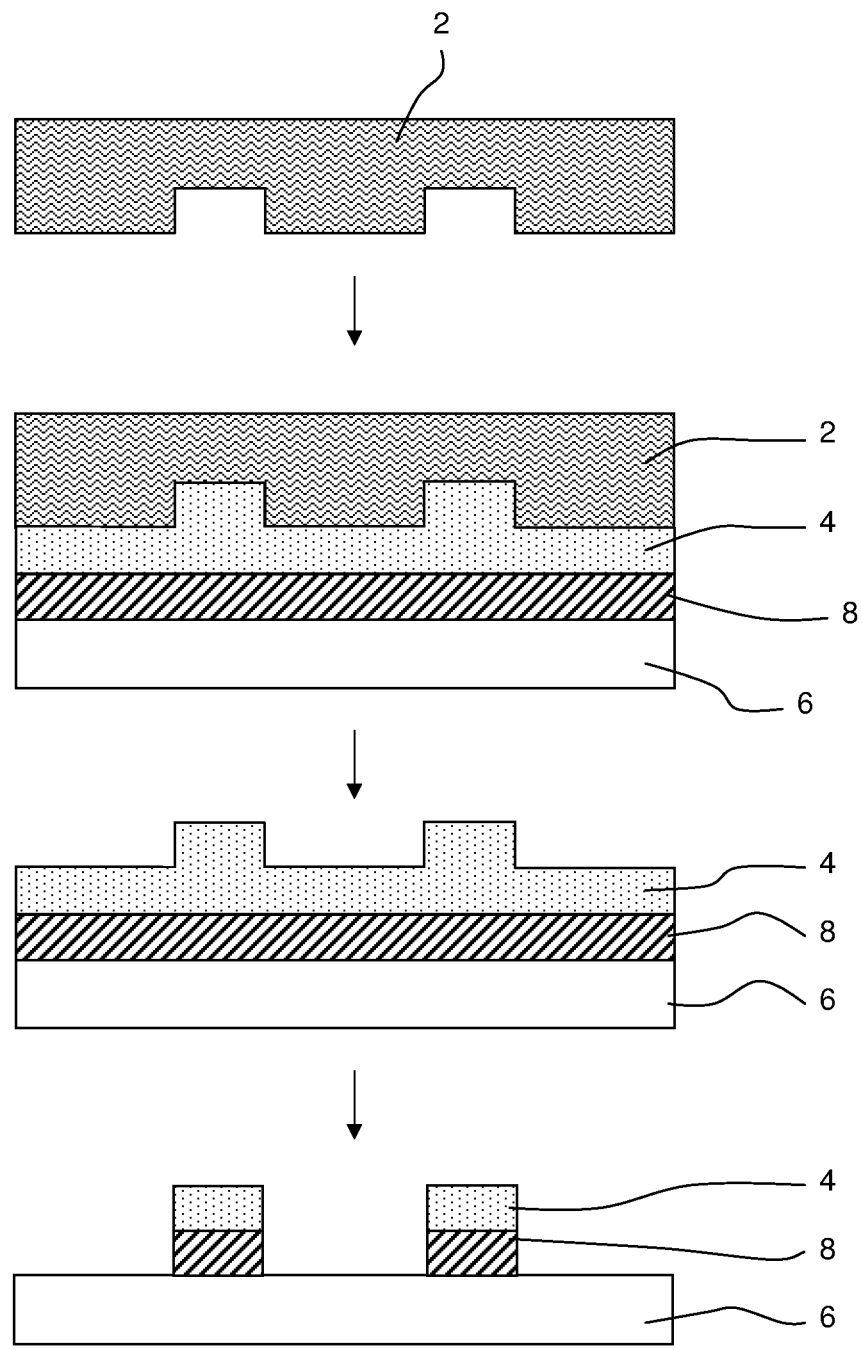
FIGS. 1A and 1B schematically depict examples of, respectively, hot imprint, and UV imprint lithography.
Figure 1B:
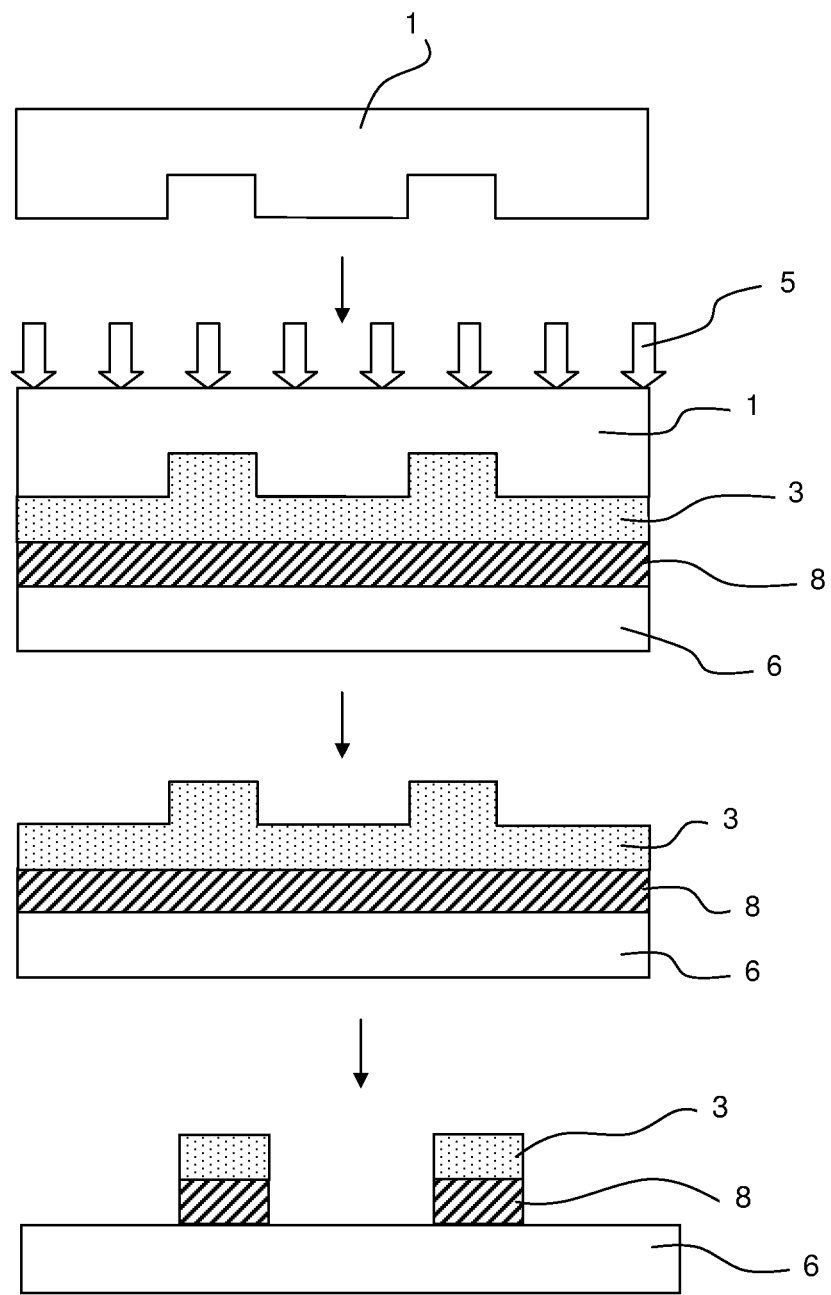

Examples of two known approaches to imprint lithography are schematically depicted in FIGS. 1A to 1B.

FIG. 1A shows an example of so-called hot imprint lithography (or hot embossing). In a typical hot imprint process, a template 2 is imprinted into a thermosetting or a thermoplastic imprintable medium 4, which has been cast on the surface of a substrate 6. The imprintable medium 4 may be, for example, resin. The resin may, for instance, be spin coated and baked onto the substrate surface or, as in the example illustrated, onto a planarization and transfer layer 8 of the substrate 6. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template 2 may then be removed and the patterned resin cooled. In hot imprint lithography employing a layer of thermoplastic polymer resin, the thermoplastic resin is heated so that it is in a freely flowable state immediately prior to imprinting with the template 2. It may be necessary to heat a thermoplastic resin to a temperature considerably above the glass transition temperature of the resin. The template is pressed into the flowable resin and then cooled to below its glass transition temperature with the template 2 in place to harden the pattern. Thereafter, the template 2 is removed. The pattern will consist of the features in relief from a residual layer of the imprintable medium which may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. Nos. 4,731,155 and 5,772,905.

FIG. 1B shows an example of UV imprint lithography, which involves the use of a transparent or translucent template 1 which is transmissive to UV and a UV-curable liquid as imprintable medium 3 (the term "UV" is used here for convenience but should be interpreted as including any suitable actinic radiation for curing the imprintable medium). UV curable liquids are often less viscous than the thermosetting and thermoplastic resins used in hot imprint lithography and consequently may move much faster to fill template pattern features. A quartz imprint template 1 is applied to a UV-curable imprintable medium 3 in a similar manner to the process of FIG. 1A. However, instead of using heat or temperature cycling as in hot imprint, the pattern is solidified by curing the imprintable medium 3 with UV radiation 5 that is applied through the quartz imprint template 1 onto the imprintable medium 3. After removal of the template 1, the imprintable medium 3 is etched (and/or undergoes other further processing) to, for example provide pattern features in or on the substrate 6. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No. 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

Combinations of the above imprint techniques are possible. See, for instance, U.S. Patent Application Publication No. 2005-0274693, which mentions a combination of heating and UV curing an imprintable medium.

FIGS. 2A to 2D schematically depict process steps for UV imprint lithography with an imprint template exhibiting regions P and Q, each having different topographies. In this schematic example, the imprint lithography template 10 is provided with recesses 11, 12 which form pattern features which can be imprinted into, and used to form pattern features in, an imprintable medium 13, as described above. The recesses 11, 12 have an intended width w, which is as intended when the imprint lithography template was designed and then constructed.

During the construction of an imprint lithography template, it is possible that one or more pattern features, such as one or more recesses or one or more protrusions, have a dimension which is not as intended in the design of the imprint lithography template. For instance, pattern features of the imprint lithography template may have a uniformity profile which varies across the imprint lithography template. Such variation in uniformity of the dimension of pattern features may arise, for example, due to variations in the processing conditions used to manufacture the imprint lithography template. For instance, such variation in processing conditions may be due to local variation or the like in plasma concentrations or densities, or e-beam writing errors, or the like.

Figure 2A:
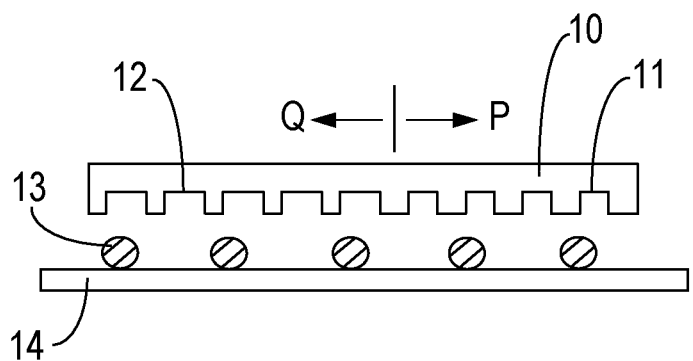
FIGS. 2A to 2D schematically depict process steps for imprint lithography with an imprint template exhibiting regions P and Q, each having different topographies.

Hence, in FIG. 2A, the width of recesses 11 in region P is w1 rather than w (smaller than intended) and the width of recesses 12 in region Q is w2 rather than w (larger than intended).

Figure 2B:
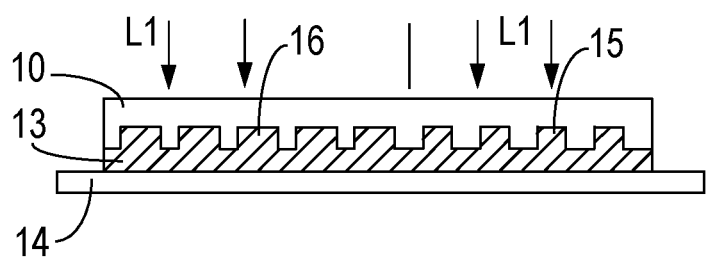

In FIG. 2A, droplets of imprintable medium 13 are shown provided on the substrate 14, for instance by ink-jet printing. As shown in FIG. 2B, the imprintable medium forms pattern features 15, 16 as protrusions by flowing into and filling recesses 11, 12 of the imprint lithography template 10. UV radiation L1 is used to irradiate and fix the imprintable medium 13 and thus to also fix the pattern features 15, 16.

Figure 2C:
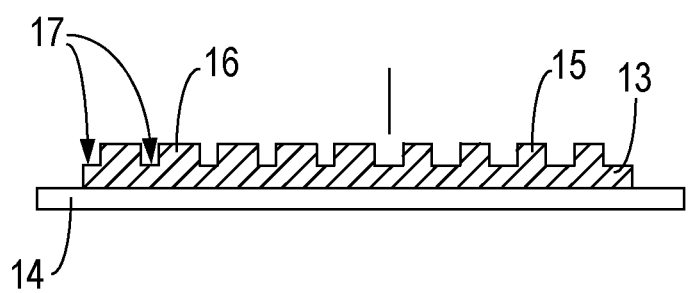

In FIG. 2C, the imprint lithography template 10 is released from the patterned layer of fixed imprintable medium 13, and leaves pattern features 15, 16 in regions P and Q respectively on a residual layer 17 of imprintable medium from which the pattern features 15, 16 extend.

Figure 2D:
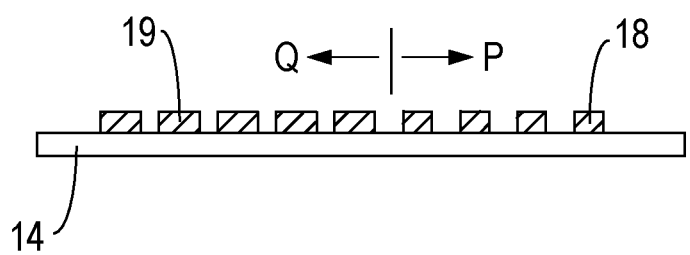

In FIG. 2D, a breakthrough etch has been undertaken to remove the residual layer 17 of the fixed imprintable medium and leave only the protrusion pattern features 18, 19 on the substrate 14. The widths of the protrusions 15, 16 are reduced during the etch as the residual layer 17 is removed, for example by a few percent or less, leading to the shapes of the final pattern features 18, 19 on the substrate.

In a further step, which is not shown in the Figures, a transfer etch is undertaken to remove parts of the substrate 14 not covered by the pattern features 18, 19. Widths of the pattern features 18, 19 are related to the widths of the recesses 11, 12 of the imprint lithography template 10 used to provide protrusions 15, 16, from which the pattern features 18, 19 are eventually developed. Thus, the widths of the pattern features eventually formed in the substrate 14 may differ from what was intended in regions P and/or Q.

FIGS. 3A to 3F schematically depict process steps for imprint lithography according to an embodiment of the invention, again with an imprint template exhibiting regions P and Q, each having different topographies, as set out above for the process shown in FIGS. 2A to 2D. However, for the example shown in FIGS. 3A to 3F, an embodiment of the invention is used to provide a resulting substrate topography which is corrected for the differences between the topographies arising from parts P and Q of the imprint template in order to provide substantially uniform feature widths for regions P and Q.

Figure 3A:
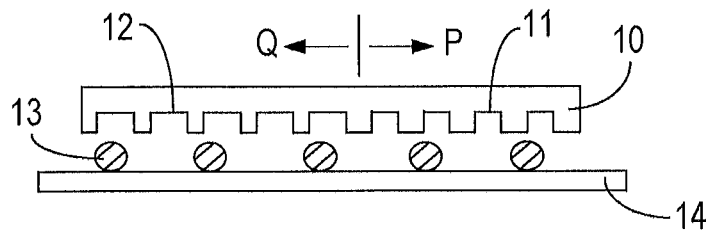
FIGS. 3A to 3F schematically depict process steps for imprint lithography according to an embodiment of the invention, again with an imprint template exhibiting regions P and Q, each having different topographies, but with an embodiment of the invention used to provide a resulting substrate topography which is corrected for the differences between the topographies arising from parts P and Q of the imprint template.
Figure 3B:
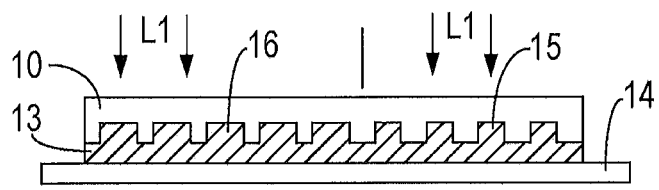

In FIG. 3A, same as for FIG. 2A, droplets of imprintable medium 13 are provided on the substrate 14, for instance by ink-jet printing. As shown in FIG. 3B, the imprintable medium forms pattern features 15, 16 as protrusions by flowing into and filling recesses 11, 12 of the imprint lithography template 10. Like the example of FIGS. 2A to 2D, UV radiation L1 (i.e. of wavelength L1) is used to irradiate and fix the imprintable medium 13 and thus the pattern features 15, 16.

Figure 3C:
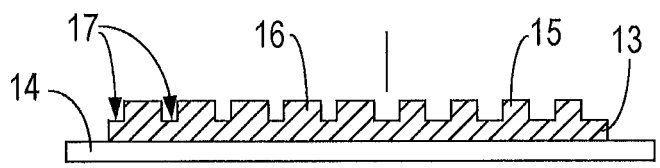

In FIG. 3C, the imprint lithography template 10 is released from the patterned layer of fixed imprintable medium 13, and leaves pattern features 15, 16 in regions P and Q respectively on a residual layer 17 of imprintable medium from which the pattern features 15, 16 extend.

Figure 3D:
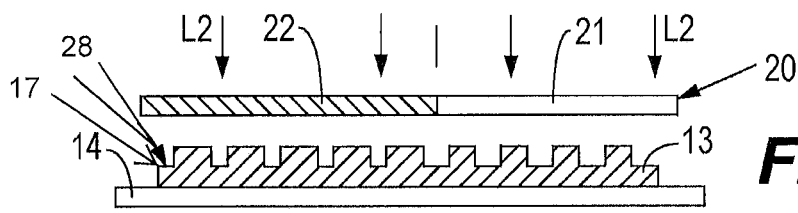

Now, the embodiment of FIGS. 3A to 3F deviates from the method shown in FIGS. 2A to 2D. As shown in FIG. 3D, a grayscale UV mask 20 is placed over the patterned imprinted layer 13 and a second dose of UV radiation L2 (i.e. of wavelength L2) is uniformly applied across the width of the mask 20. The mask has two sections, sections 21 and 22; section 21, over region P, is substantially transparent to the UV radiation L2 whereas section 22, over region Q, is substantially opaque to UV radiation L2.

Figure 3E:
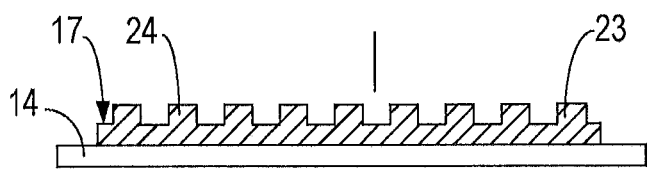

In FIG. 3E, after the selective, localized irradiation with UV radiation L2, the patterned layer of fixed imprintable medium is held for a suitable period of time at a temperature less than but close to, or in excess of, its glass transition temperature. In this embodiment, the imprintable medium 13 comprises two monomer types, acrylate and epoxy monomers, and also comprises a radical initiator activated by UV radiation L1 and a UV photoacid generator, activated by UV radiation L2.

Hence, following the irradiation with the UV radiation L1, the patterned layer of imprintable medium is fixed as the acrylate monomer is induced to polymerize by UV radiation L1 in combination with the radical generator. However, the epoxy monomer is not substantially polymerized by UV radiation L1, and remains substantially as unreacted monomer in the fixed imprintable medium layer 13 shown in FIG. 3C.

When the UV radiation L2 is applied through the grayscale filter 20 as shown in FIG. 3D, unreacted epoxy monomer in region P under the transparent section 21 of mask 20 is induced to commence polymerization by UV radiation L2, whereas the epoxy monomer in region Q under the opaque section 22 of mask 20 remains substantially unreacted.

After illumination, as shown in FIG. 3E, the twice irradiated layer of fixed imprintable medium 13 is allowed to develop at a temperature less than but close to, or in excess of, its glass transition temperature Tg. Polymerization of the epoxy monomer in region P will proceed, leading to depletion of the monomer concentration in that region, leaving high levels of epoxy monomer in region Q. This difference in monomer concentrations will drive diffusion of the epoxy monomer from Q towards P, leading eventually to higher final equilibrium concentrations of epoxy monomer in region P than in region Q.

This may lead either to physical bulking of width of the protrusions 23 in region P at the expense of the size of the width of the protrusions 24 in region Q, or it may be that the epoxy monomer is provided with a functional group effective to make the imprintable medium in protrusions 23 more resistant to a breakthrough etch than the protrusions 24. For instance, the epoxy monomer may be functionalized with a silicon functional group so that the imprintable medium in region P has a higher final Si-content than the imprintable medium in region Q, making it more resistant to the breakthrough etch.

Figure 3F:
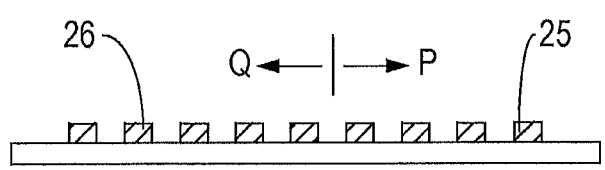

In FIG. 3F, a breakthrough etch has been undertaken to remove the residual layer 17 of the fixed imprintable medium and to leave only the pattern features 25, 26 on the substrate 14. The widths of the pattern features 23, 24 are also reduced during the etch as the residual layer 17 is removed, for example by a few percent or less, but it may be that the pattern features 23 are either bulked up, or more resistant to the breakthrough etch, than the pattern features 24, and so any difference in width, arising from the different widths of recesses 11, 12 for regions P and Q of the imprint template, is reduced in the eventual pattern features 25, 26.

In a further step, which is not shown in the Figures, a transfer etch is undertaken to remove parts of the substrate 14 not covered by the pattern features 25, 26 so that the desired topography is transferred to the substrate.

A typical composition of imprintable medium comprises an acrylate based monomer, a UV-photoinitiator (generating free radicals when excited with UV) and a surfactant such as a fluorosurfactant. By incorporation into the composition of a less UV-sensitive and slower polymerizing monomer (e.g. an epoxy based monomer), a second UV polymerization step may be made possible. This permits temporal separation of the polymerization reactions for the two monomer types.

The first flash UV-exposure (UV radiation L1) during the imprint polymerizes the acrylate homogeneously and forms a fixed polymer film. The second local UV-exposure (UV radiation L2) polymerizes the slower-reacting epoxy monomer allowing for modification of the topography to be achieved. Local intensity variation for UV radiation L2, achieved using a grayscale mask in the embodiment, induces polymerization of the slowly reacting epoxy monomer locally, leading to monomer depletion in the illuminated area. The difference in local monomer concentration leads to diffusion of the monomer towards the illuminated area. Typically, a heating step may be used to increase the mobility of the monomer. The diffusion distance of the monomer may be in the order of microns over a timescale of one second or less. Consequentially, the achieved topography may be modifiable on this time scale, during the second illumination step, using the method described.

A development step, extending for a time period after the second, localized UV-exposure step, may be used to remove the slow-reacting monomer that has not reacted from the layer of fixed imprintable medium. With a development step, constraints on size and scale are less important, and the topography may be corrected across an entire substrate.

Rather than the imprintable medium being directly applied to a substrate, as shown in the Figures, it may be applied to an optional anti-reflection coating layer and/or planarization layer on a substrate, for instance as detailed in FIG. 1B.

Typically, only a limited number of locations or parts of a patterned imprintable medium may need to be subjected to illumination with second UV irradiation. Rather than a grayscale mask, a laser spot of the second UV radiation may illuminate only selected parts that need correction. In an embodiment, illumination with second UV radiation may be achieved locally using near field optics to create an illumination spot size of the order of 50 nm or greater. The second UV radiation L2 may, for instance, have a wavelength of 193 nm. A typical wavelength for L1 is 365 nm.

The described and illustrated embodiment is to be considered as illustrative and not restrictive in character, it being understood that only a preferred embodiment has been shown and described and that all changes and modifications that come within the scope of the inventions as defined in the claims are desired to be protected.

In an embodiment, rather than allowing unreacted monomer to diffuse after the second exposure step, this diffusion may be prevented or inhibited by maintaining the patterned layer of fixed imprintable medium at a temperature well below its glass transition temperature, Tg, say at least 20° C. below Tg. For this embodiment the unreacted monomer may removed from the patterned layer by a development step using an appropriate solvent to leach the monomer from the layer. Local differences in the concentration of fixed, polymerized monomer may result again in local Si-concentration differences in the layer of patterned imprintable medium, leading again to localized variation in breakthrough etch behavior used to compensate for differences in topography.

In an embodiment, after a first UV exposure step, using first UV radiation L1 which polymerizes a first, fast reacting monomer of the imprintable medium, a local heating step may be used to polymerize a second, slow reacting monomer of the imprintable medium (i.e. without the need for further UV illumination). Locally increasing the temperature increases not only the polymerization rate, but also increases the mobility of the non-reacted monomer present in the polymer network of the already reacted first monomer. By application of a temperature gradient, the local monomer concentration for the second monomer, and therefore the final breakthrough etch resistance (or other property) may be adapted locally to correct for topography differences.

An embodiment of the invention may be carried out by modification locally of the etch resistance (e.g. breakthrough etch resistance), and/or of the physical volume of features, and/or of the shrinkage of features on development of the patterned layer of fixed imprintable medium.

In an embodiment, the first UV illumination L1 may fix the resist and the second, local exposure for correction of topography may be carried out in a second illumination using local application of the same UV wavelength L1 as the first UV illumination, but at a substantially higher intensity, whereby the breakthrough etch-resistance of the imprinted layer is locally reduced. In an embodiment, a second exposure to actinic radiation may be used to ablate the imprinted layer locally.

It will be appreciated that in order to produce a difference between an actual topography of a part of a patterned layer of imprintable medium and an intended topography, the actual topography should be determined. This can be undertaken by measuring (i.e. determining) a topography of the part of the patterned layer of imprintable medium after imprinting, for example using one or more optical inspection apparatus and techniques or the like. Alternatively or additionally, the actual topography may be determined or derived or measured by measuring a topography of a part of the imprint lithography template that was, or is to be, used to form the part of the patterned layer of imprintable medium.

In the embodiments described above, the correction of the topography of a single pattern feature type has been shown. In practice, a correction in topography may be applied across a number or area of pattern features. Correction of the topography of a single pattern feature is achievable if the method can be undertaken on the scale of the pattern feature, while desirably not affecting the topography of adjacent pattern features. In practice, a change from an intended topography may extend across and include a plurality of pattern features, due to the nature of the process condition that caused the change in topography (e.g. a micrometer or greater sized region of non-uniformity in etch conditions, or the like). Thus, for cost and complexity reasons, it may not be required or desirable to provide a method that is able to correct for non-uniformity in a topography of a single pattern feature.

In addition to or rather than the correction in topography being achieved through a chemical reaction modified by application of a second local dose of UV radiation, localized heating may be undertaken to adjust the chemical reaction using one or more discrete conductive/radiative heating elements or the like. Nevertheless, one of the more convenient ways of providing localized heating is via the use of one or more beams of radiation, for example, infrared radiation or any radiation which is sufficient in intensity and/or wavelength and/or energy.

In an example, the heating may be provided by intersecting two or more beams of radiation 28 at a point adjacent to, or at, the part of the patterned layer of imprintable medium 13 where correction of the topography is desired by modification of a chemical reaction. Any one beam in isolation may not provide sufficient energy to result in the addition of material to the layer of imprintable medium, but the intersection of two or more beams of radiation may result in the energy at intersection point exceeding a threshold value required to ensure that the chemical reaction is modified.

The use of a radiation beam to provide heating in this way is desirable in comparison with, for example, discrete conducting/radiating heating elements or the like. This is because the position and/or intensity of a radiation beam may be controlled accurately, quickly, and with a high degree of resolution, which may not be possible (or at least as easy to undertake) with conductive/radiative heating elements or the like.

The present invention relates to imprint lithography methods. The imprint lithography method may be used for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc. The imprint lithography method may be used to obtaining an imprint lithography template. This might be advantageous, since an imprint lithography template made in this manner will have a topography which is as intended, or one that is closer to that intended. Thus, devices or the like made using the imprint lithography template made in this manner will also have a topography which is as intended, or one that is closer to that intended.

The pattern features described above may have one or more sub-micron (e.g. of the order of nanometers) dimensions.

In this specification, the term "substrate" is meant to include any surface layers forming part of the substrate, or being provided on another substrate, such as planarization layers or anti-reflection coating layers.

In use, an imprint lithography template may be held by an imprint lithography template holder. The imprint lithography template holder may hold the imprint lithography template using one of a number of different mechanisms, for example using electrostatic or magnetic force, mechanical force (e.g.

via the use of one or more piezoelectric elements or the like) and/or by vacuum force. The imprint lithography template may be moved by appropriate movement of the imprint lithography template holder. In use, a substrate may be held by a substrate holder. The substrate holder may hold the substrate using one of a number of different mechanisms, for example using electrostatic or magnetic force, mechanical force (e.g. a clamp or the like) and/or by vacuum force. The substrate may be moved by appropriate movement of the substrate holder.

In the above embodiments, a single imprint lithography template, a single imprint lithography template holder, a single substrate holder and a single substrate is described as being provided, and for example in a single chamber. In other embodiments, more than one imprint lithography template, more than one imprint lithography template holder, more than one substrate holder, and/or more than one substrate may be provided in one or more chambers, in order for imprints to be undertaken more efficiently or quickly (e.g. in parallel). For example, in an embodiment, there is provided an apparatus that includes a plurality (e.g. 2, 3, or 4) of substrate holders. In an embodiment, there is provided an apparatus that includes a plurality (e.g. 2, 3, or 4) of imprint lithography template holders and/or templates. In an embodiment, there is provided an apparatus configured to use one template holder and/or imprint lithography template per substrate holder. In an embodiment, there is provided an apparatus configured to use more than one template holder and/or imprint lithography template per substrate holder. In an embodiment, there is provided an apparatus that includes a plurality (e.g. 2, 3, or 4) of imprintable medium dispensers. In an embodiment, there is provided an apparatus configured to use one imprintable medium dispenser per substrate holder. In an embodiment, there is provided an apparatus configured to use one imprintable medium dispenser per imprint lithography template. In an embodiment, where an apparatus is provided that includes a plurality of substrate holders, the substrate holders may share functionalities in the apparatus. For instance, the substrate holders may share a substrate handler, a substrate cassette, a gas supply system (e.g. to create a helium environment during imprinting), an imprintable medium dispenser, and/or a radiation source (for curing the imprintable medium). In an embodiment, two or more of the substrate holders (e.g. 3 or 4) share one or more functionalities of the apparatus (e.g. 1, 2, 3, 4, or 5 functionalities). In an embodiment, one or more functionalities (e.g. 1, 2, 3, 4, or 5) of the apparatus are shared among all substrate holders.

It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion or part" and/or "a portion or part" is used the item can include a portion or part and/or the entire item unless specifically stated to the contrary.

The invention claimed is:

1. An imprint lithography method for reducing a difference between an intended topography and an actual topography arising from a part of a patterned layer of fixed imprintable medium, the method comprising:

imprinting an imprint lithography template into a layer of flowable imprintable medium to form a patterned layer in the imprintable medium;

fixing the imprintable medium to form a patterned layer of fixed imprintable medium; and separate from fixing the imprintable medium, applying local excitation to the part of the patterned layer having a topography by contact from the imprint lithography template to adjust a chemical reaction in the part of the patterned layer to reduce the difference between the intended topography and the actual topography arising from the part of the fixed patterned layer of imprintable medium.

2. The imprint lithography method of claim 1, wherein the imprintable medium is fixed by curing with a first actinic radiation.

3. The imprint lithography method of claim 2, wherein the fixing by curing with first actinic radiation comprises a polymerization reaction of a first monomer of the imprintable medium.

4. The imprint lithography method of claim 3, wherein the chemical reaction comprises a polymerization reaction of a second monomer of the imprintable medium.

5. The imprint lithography method of claim 4, wherein second monomer remaining unpolymerized after the polymerization reaction is removed by leaching from the fixed imprintable medium using a solvent leach.

6. The imprint lithography method of claim 1, wherein the local excitation comprises local application to the part of the patterned layer of a selected dose of actinic radiation.

7. The imprint lithography method of claim 2, wherein the local excitation comprises local application to the part of the patterned layer of a selected dose of second actinic radiation.

8. The imprint lithography method of claim 1, wherein the local excitation is applied after fixing the imprintable medium to form a patterned layer of fixed imprintable medium.

9. The imprint lithography method of claim 8, wherein the local excitation is applied after removal of the imprint lithography template from the patterned layer of fixed imprintable medium.

10. The imprint lithography method of claim 1, wherein a mask is used to control local application of the local excitation.

11. The imprint lithography method of claim 1, wherein the local excitation comprises or consists of local heating of the part of the patterned layer.

12. The imprint lithography method of claim 11, wherein the local heating is provided by a beam of radiation.

13. The imprint lithography method of claim 12, wherein the local heating is provided by intersecting two or more beams of radiation at a point adjacent to the part of the patterned layer.

14. The imprint lithography method of claim 1, wherein the chemical reaction comprises a chemical reaction of a reacting compound, leading to depletion of the reacting compound in the part of the patterned layer so that diffusion of the reacting compound into the part of the patterned layer is induced.

15. The imprint lithography method of claim 14, wherein the reacting compound comprises a compound resistant to etching.

16. The imprint lithography method of claim 1, wherein the actual topography arising from the part of the patterned layer of fixed imprintable medium is determined by measuring a topography of the part of the patterned layer of fixed imprintable medium.

17. The imprint lithography method of claim 1, wherein the fixed imprintable medium is maintained at a temperature within 20°C. of the glass transition temperature of the imprintable medium, while the chemical reaction takes place.

18. An imprint medium for imprint lithography comprising first and second monomers, wherein the imprint medium is curable by a polymerization reaction of the first monomer induced by a first excitation leaving the second monomer substantially unpolymerized, and wherein the second monomer is polymerizable by a second excitation, wherein the first monomer is substantially polymerizable by the first excitation comprising irradiation with a first dose of first actinic radiation and wherein the second monomer is substantially polymerizable by the second excitation comprising irradiation with a second dose of the essentially same first actinic radiation.

19. An imprint lithography method for reducing a difference between an intended topography and an actual topography arising from a part of a patterned layer of fixed imprintable medium, the method comprising:
   imprinting an imprint lithography template into a layer of flowable imprintable medium to form a patterned layer in the imprintable medium, the imprintable medium comprising a first monomer and a second monomer;
   fixing the imprintable medium to form a patterned layer of fixed imprintable medium; and
   applying local excitation to the part of the patterned layer to adjust a chemical reaction in the part of the patterned layer to reduce the difference between the intended topography and the actual topography arising from the part of the fixed patterned layer of imprintable medium, wherein the chemical reaction comprises a polymerization reaction of a second monomer of the imprintable medium.

20. An imprint lithography method for reducing a difference between an intended topography and an actual topography arising from a part of a patterned layer of fixed imprintable medium, the method comprising:
   imprinting an imprint lithography template into a layer of flowable imprintable medium to form a patterned layer in the imprintable medium;
   fixing the imprintable medium to form a patterned layer of fixed imprintable medium by application of a first actinic radiation; and
   applying local excitation to the part of the patterned layer to adjust a chemical reaction in the part of the patterned layer to reduce the difference between the intended topography and the actual topography arising from the part of the fixed patterned layer of imprintable medium, wherein the local excitation comprises local application to the part of the patterned layer of a selected dose of second actinic radiation.

* * * * *